United States Patent [19]

Lusignea et al.

[11] Patent Number: 4,975,312

[45] Date of Patent: Dec. 4, 1990

[54] MULTIAXIALLY ORIENTED THERMOTROPIC POLYMER SUBSTRATE FOR PRINTED WIRE BOARD

[75] Inventors: Richard W. Lusignea, Brighton; James L. Racich, Framingham; Andrew C. Harvey, Waltham; Ruby R. Chandy, Cambridge, all of Mass.

[73] Assignee: Foster-Miller, Inc., Waltham, Mass.

[21] Appl. No.: 209,281

[22] Filed: Jun. 20, 1988

[51] Int. Cl.$^5$ ............................................. B32B 9/00
[52] U.S. Cl. .................................. 428/209; 428/337; 428/419; 428/901; 361/397; 361/398; 361/414; 528/176
[58] Field of Search ............... 428/419, 337, 209, 901; 174/68.5; 361/397, 398, 414; 528/176, 183, 190, 191, 193, 194, 271, 313

[56] References Cited

U.S. PATENT DOCUMENTS

| | | | |
|---|---|---|---|
| 3,595,736 | 7/1971 | Buteux | 428/910 |
| 3,598,637 | 8/1971 | Stoll et al. | 428/910 |
| 3,681,297 | 8/1982 | D'Alelio | 548/152 |
| 4,041,206 | 8/1977 | Tsunashima et al. | 428/910 |
| 4,332,759 | 6/1982 | Ide | 264/108 |
| 4,353,974 | 10/1982 | Yamaoka et al. | 174/68.5 |
| 4,370,293 | 1/1983 | Peterson-Hoj | 264/514 |
| 4,384,016 | 5/1983 | Ide et al. | 428/1 |
| 4,487,735 | 12/1984 | Chenevey et al. | 264/85 |
| 4,533,692 | 8/1985 | Wolfe et al. | 528/183 |
| 4,533,693 | 8/1985 | Wolfe et al. | 528/176 |
| 4,533,724 | 8/1985 | Wolfe et al. | 528/313 |
| 4,547,416 | 10/1985 | Reed et al. | |
| 4,554,119 | 11/1985 | Chenevey | 264/85 |
| 4,569,885 | 2/1986 | Yamaguchi et al. | 428/910 |
| 4,600,765 | 7/1986 | Lee et al. | 528/193 |
| 4,624,872 | 11/1986 | Stuetz | 428/1 |
| 4,659,408 | 4/1987 | Redding | |
| 4,668,760 | 5/1987 | Boudreaux, Jr. et al. | 54/193 |
| 4,699,821 | 10/1987 | Hallock | |
| 4,721,637 | 1/1988 | Suzuki et al. | |
| 4,772,089 | 9/1988 | Ide et al. | |
| 4,774,632 | 9/1988 | Neugebauer | 361/414 |
| 4,778,244 | 10/1988 | Ryan | 350/96.23 |
| 4,786,348 | 11/1988 | Luise | 421/296 |

FOREIGN PATENT DOCUMENTS 5116363  7/1976  Japan ................................. 264/559

OTHER PUBLICATIONS

F. Dance, Electronic Production, 42–48 (1982).
Amick et al., Thermal Analyses of Chip Carrier Compatible Substrates, McDonnell Douglas Elec. Co., 34–39.
C. Guiles, SAMPE Journal, 77–80 (1985).
D. Packard, SAMPE Journal, 6–14 (1984).
B. Rodini, Air Force Contract Review Report, Apr., 1986.
L. Zakraysek, Air Force Contract Review Report, General Electric, Aug., 1985.
Pillar and Lorraine, Air Force Contract Review Report, Apr., 1986.
R. Belke, Jr., Air Force Contract Review Report, Apr., 1986.
Concerning the Negative Thermal Experience for Extended Chain Polyethylene, Porter et al., J. Thermal Anal., vol. 8, pp. 547–555, 1975.
CA 88-159438/23, Apr. 20, 1988, anonymous.

Primary Examiner—Patrick J. Ryan
Attorney, Agent, or Firm—David G. Conlin; Ernest V. Linek; Linda M. Buckley

[57] ABSTRACT

The present invention is directed to the use of multiaxially oriented (e.g., biaxially) thermotropic polymers as a substrate material for the preparation of printed wire boards (PWB). In preferred embodiments, the PWB of the present invention comprises a generic, high density, organic multilayer PWB comprising XYDAR ® and/or VECTRA ® films, capable of being employed as a high density leadless perimeter and in grid array ceramic chip packages.

21 Claims, No Drawings

MULTIAXIALLY ORIENTED THERMOTROPIC POLYMER SUBSTRATE FOR PRINTED WIRE BOARD

STATEMENT OF GOVERNMENT INTEREST

Funding for the present invention was obtained from the Government of the United States by virtue of Contract N00164-87-C-0050 from the Department of the Navy. Thus, the Government of the United States has certain rights in and to the invention claimed herein.

BACKGROUND OF THE INVENTION

The present invention is directed to the use of multiaxially oriented thermotropic polymers as a substrate material for the preparation of printed wire boards (PWB). Major advances have recently been made in progressing from conventional dual in-line packages (DIP) to direct surface mounting packages (DSM).

DIPs are generally limited in size by the large pins which must be mounted through holes in the circuit board. DSMs can be mounted on both sides of the boards and have both more and smaller input/output (I/O) connections.

The full benefits of increased speed and reduced size and weight in PWBs have not yet been realized because interconnection of DSM devices has not kept pace with I/O density and the reduction in size possible with leadless perimeter and grid array packages.

One of the major problems of using leadless ceramic chip carriers in advanced avionics (VHSIC and VLSI) applications is the mismatch between the coefficient of thermal expansion (CTE) of alumina chip carriers (6.4 ppm/°C.) and conventional glass/epoxy substrates (12 to 17 ppm/°C.). This mismatch results in work-hardening and cracking of solder joints which attach the DSM chips to the substrate.

Thermal cycles as extreme as $-65°$ to $+125°$ C. may be encountered and are known to cause solder failure and other damage. As demonstrated herein, molecularly oriented thermotropic polymer films can solve this problem because their CTE can be matched to the ceramic CTE. Moreover, these polymers have excellent dielectric properties, and films can be produced from multiaxially (e.g., biaxially) oriented thermotropic polymer which show significant advantages over other high performance substrates.

Fiber reinforced substrates (Kevlar and graphite reinforcement) are being developed to match the ceramic CTE, but these materials have drawbacks. Fibers must be woven into a fabric, or cross-plied resulting in increased thickness and anisotropy at a relatively large scale (fiber tow diameters are about 0.002 in., minimum fabric thickness is about 0.0045 in.). Additional problems of high dielectric constant and costly manufacturing are discussed below.

Copper-Invar-Copper (CIC) laminated foils can provide matched CTE, but these materials are relatively heavy (this precludes their use in avionics applications) and require insulation on the surface and inside vias (holes which connect multilayers).

Ceramic substrates are not considered because their brittleness and high dielectric constant (9-10) rule them out. Recently, Hitachi, Inc., has reported low CTE polyimide film, see for example, Numota et al., "Chemical Structures and Properties of Low Thermal Polyimides," p. 492-510, *Proceeding of the Second International Conference on Polyimides*, Society of Plastics Engineers, Inc., (1985), but this material is still in the early development stages.

Polyimide films also suffer from high moisture absorption (5 percent by weight) which degrades dielectric performance and causes hygroscopic expansion.

Advanced computer systems are dependent upon very high density circuit boards having a large number of internal planes, many conducting circuit lines, and a multitude of holes formed in close proximity to the internal conductors. Using present materials and conductor technologies, minimum conductor widths of 3 mil and 3 mil spacings are possible at best. Higher density PWBs are needed to meet the increasing density of circuits packages on semiconductor devices and modules.

SUMMARY OF THE INVENTION

It has been discovered that multiaxially (e.g., biaxially) oriented thermotropic polymer films, preferably or XYDAR ® or VECTRA ®, can be used as the substrate for printed wire boards and advanced interconnects to fill the current gap in such materials.

The most preferred printed wire board (PWB) substrate of the present invention is a nonelectrically conducting, low-moisture absorption, multi-layer PWB laminate made from XYDAR ® or VECTRA ® which has the following properties:

Tailorable coefficient of thermal expansion (CTE) (X-Y direction) in range of from about 3 to 7 X $10^{-6}$ in.-/in./°C.

CTE of thickness (Z direction) approaching that of the copper used for the plated through holes.

Low-moisture absorption, i.e., not to exceed about 0.5 percent at saturation.

Maximum thickness of a single layer not to exceed 0.0025 in.

Interlaminar shear strength shall be greater than glass-/Kerimid 601 or equal to glass/epoxy.

Flexural strength equivalent to glass/ polyimide.

Dielectric constant not to exceed about 3.5 over the functional frequency range of 1 kHz to 500 MHz, other electrical properties similar to standard glass-/polyimide.

In preferred embodiments, the PWB of the present invention comprises a generic, high density, organic multilayer PWB capable of being employed as a high density leadless perimeter and in grid array ceramic chip packages.

Specific chip package density requirements are 0.020-in. centers with up to 300 input/outputs (I/Os) for perimeter type packages and 0.050-in. center grid array type packages with up to 240 I/Os per device.

In its most preferred embodiments, the present invention is directed to a method of forming a XYDAR ® or VECTRA ® PWB substrate layer of 0.0025 in. or less in thickness, which can meet or exceed the previously specified property requirements. Measurements of specific desired properties, such as CTE, are conducted using ASTM D-696 or its equivalent and dielectric constant measurements are conducted using ASTM D-150 or its equivalent.

Another preferred aspect of this invention involves the discovery that XYDAR ® or VECTRA ® films can be bonded together to form a suitable laminate for multilayer board (MLB) construction.

The substrate surface preparation techniques of this invention are essential to the development of suitable lamination technology.

DETAILED DESCRIPTION OF THE PREFERRED EMBODIMENTS

Samples of randomly ordered XYDAR ® or VECTRA ® polymer were obtained from their manufacturers, Dartco Mfg., Inc. and Celanese respectively, were processed under a variety of processing conditions, each of which yielded films with varying degrees of molecular orientation.

The preferred processing method for preparing multiaxially oriented films of XYDAR ® and/or VECTRA ® was the use of a counter-rotating tube die, as described in Harvey et al., U.S. Ser. No. 098,710, filed 21 Sept. 1987, the disclosure of which, to the extent necessary is hereby incorporated herein by reference.

Orientations investigated included uniaxial, balanced angle biaxial of ±43 deg., and random. Samples of films produced were tested to determine the CTE in both the machine and transverse directions. These samples were also investigated to determine the dielectric constant.

Highly oriented XYDAR ® or VECTRA ® film has a negative CTE in the direction of orientation and a positive CTE transverse to that direction.

A significant discovery of this invention was that the anisotropic thermal expansion behavior can be used to tailor the overall CTE of biaxially oriented films, and these films can be used to make useful PWB substrates with an in-plane CTE of from about $+3$ to $+7 \times 10^{-6}$ in./in./°C.

Another preferred embodiment of the present invention involves the use of XYDAR ® or VECTRA ® films to form a laminate suitable for multilayer boards (MLB)

In connection with this aspect of the invention, a number of alternate surface treatments and adhesives were evaluated. The results of both epoxy and polyimide adhesives indicated that a surface modified XYDAR ® or VECTRA ® , i.e., Xydar or Vectra film whose surface was treated with either a dichromate or a sulfuric acid etch, or by simple mechanical abrasion, adhesion is adequate for MLB applications.

An alternative bonding technique which does not require surface treatment also showed promising results. This method involves modifying the XYDAR ® or VECTRA ® film, resulting in a "pre-preg" or preimpregnated film which can be subsequently bonded.

The rod-like molecules of XYDAR ® or VECTRA ® and other thermotropic ordered polymers gives rise to a self-reinforced microstructure which can be oriented to control the CTE. Thus, the molecularly oriented polymer substrate CTE can be matched to that of the ceramic chip carriers, eliminating fracture at the solder joints of DSM components.

The present invention is based upon the discovery that XYDAR ® or VECTRA ® film has an inherent negative CTE and is quite stiff, making it useful in conjunction with positive CTE metallic ground planes, thermal control layers, signal layers, and laminating resins.

Test data and calculations show that XYDAR ® or VECTRA ® film can be used in advanced PWBs to achieve 6 ppm/°C., matching leadless ceramic chip carriers.

Test data also indicate that XYDAR ® or VECTRA ® film has the capability for high signal propagation speeds (dielectric constant less than 3.0), and low loss of electrical signal into the substrate (dissipation factor less than 0.010).

Other properties which make XYDAR ® or VECTRA ® film an attractive material for advanced PWBs are:

Surface smoothness is not affected by fiber size and does not show micro-cracking as in fabric-reinforced composites Film thickness $\leq 2$ mils can easily be achieved, as opposed to a minimum of 3.5 mils for composites Very high temperature capabilities for both manufacturing (plating and soldering) and service High strength and stiffness for good mechanical properties needed in lightweight high performance boards Low moisture pickup and excellent environmental resistance.

To understand the tailorable CTE of XYDAR ® or VECTRA ® molecularly oriented polymer films, it is necessary to review the processing and morphology of these materials.

During, the orientation step, the rod-like molecules of XYDAR ® or VECTRA ® are formed into a microfibrillar network with homogeneity down to a very fine scale. It has been discovered that the dimensions of this microfibrillar network are on the order of about 100A. Thus, the self-reinfored material will appear continuous to the relatively large electronic components, printed conductors and other features of the electronic package.

After the XYDAR ® or VECTRA ® film has been finished by drying and heat treatment, the mechanical properties are consistent and repeatable and the film shows excellent environmental stability including low moisture pickup (less than 0.5 percent by weight after 24 hr. immersion at 25° C.)

The completely processed films are thermoset; that is, they cannot be further formed by application of heat and pressure. In fact, tests of tensile strength at 300° C. indicate that the materials retain 75 percent of room temperature properties, (Thomas et al., "Mechanical Properties Versus Morphology of Ordered Polymers," Vol. II, Technical report AFWAL TR 80-4045, July 1981).

Multiaxial film processing techniques have been developed which result in films having a specific, controllable molecular orientation in the plane of the film. X-ray diffraction studies have shown a high degree of order through the thickness of the films, confirming that the molecules lie predominantly in the film plane.

In the extreme case, all molecules are oriented in the machine direction (the direction of film advance during processing), a situation called uniaxial orientation.

Biaxially oriented films have the morphology where the principal orientation direction are ±45° to the machine direction.

Film morphology values of ±45° are somewhat idealized, as some molecules will have orientations between these two directions, as well as out of the plane of the film, thus, the general term multiaxial is employed to define the non-ideal results.

In the present invention, an ideal biaxial film would comprise uniaxial plies of XYDAR ® or VECTRA ® , analogous to fiber-reinforced plies in a composite. Such uniaxial XYDAR ® or VECTRA ® plies would have both longitudinal and transverse properties to account for both the primary direction and random distribution of molecules in the plane of the film.

The negative CTE of XYDAR ® or VECTRA ® film in the primary orientation direction is similar to that noted for lyotropic molecularly oriented polymers, such as poly paraphenylene benzobisthiazole (PBzT), poly paraphenylene benzobisoxazole (PBzO), and the like, see Wolfe et al., U.S. Pat. Nos. 4,533,692; 4,533,693; and 4,533,724, XYDAR ® or VECTRA ® fibers, as well as other high modulus fibers including graphite, polyaramid (Kevlar) and ultra-drawn polyethylene (Porter et al., "Concerning the Negative Thermal expansion for Extended Chain Polyethylene," Journal of *Thermal Analysis*, Vol. 8, pp. 547–555 (1975).

These high modulus fibers exhibit a negative CTE in the axial direction, and positive CTE in the transverse direction. When these fibers are used in conjunction with a positive CTE matrix material (such as epoxy or polyimide), the net thermal expansion can be tailored to the 3 to 7 ppm/°C. desired for PWB substrates. This may be done by controlling the fiber-to-resin ratio and cross-plying the unidirectional fiber layers. XYDAR ® or VECTRA ® films have no matrix component, but the negative CTE in the transverse direction.

In the simplest model of a biaxial film, two hypothetical uniaxial plies are oriented at ±∅ to the machine direction, approximating the actual orientation of XYDAR ® or VECTRA ® biaxial films. When ∅=0, this degenerates to the uniaxial case, and when ∅=45 deg. the longitudinal (machine direction) and transverse properties are equal like a cross-plied fiber-reinforced composite.

Because of the very high longitudinal stiffness of the XYDAR ® or VECTRA ® rod-like molecules, even the ±45 degree film calculations show a negative CTE in the plane of the film (isotropic negative CTE behavior). Thus the XYDAR ® or VECTRA ® film is analogous to the negative CTE fiber, but exhibits this in two dimensions rather than one, making isotropic planar reinforcement possible.

XYDAR ® or VECTRA ® films exhibit a negative CTE in the plane of the film. This behavior can be used to counteract the positive CTE of copper conductors, ground planes, thermal control layers, and resin used to bond the MLB together.

However, because of the high strength and stiffness of XYDAR ® or VECTRA ® film, less material will be needed in relation, to the same amount of copper. A properly designed XYDAR ® or VECTRA ® substrate could support more copper than conventional substrate materials, making the finished MLB smaller and lighter. Advantageously, the relative copper content could be form about 20 to 30 percent, bringing the overall in-plane CTE into the desired range.

The overall MLB thickness can be substantially reduced by using thin XYDAR ® or VECTRA ® films. E-glass/epoxy fabric-reinforced PWBs are limited to about 4 to 5 mils thickness because of yarn diameter and weave. XYDAR ® or VECTRA ® films 1 to 2 mils thick could support the same copper layers as the E-glass boards, but at one-fourth to one-half the thickness.

High speed circuits with switching frequencies in the gigahertz (GHz) range will be limited by the speed of propagation which is a function of the dielectric constant. A dielectric constant of less than about 3.0 is required for such advanced applications. This will also reduce line capacitance and the power required to drive devices. A low dissipation factor (less than about 0.010) is needed to minimize loss of signal into the substrate.

XYDAR ® or VECTRA ® films have dielectric properties that are attractive for high speed circuit applications. The only material with a dielectric constant and dissipation factor significantly lower than XYDAR ® or VECTRA ® is poly-tetrafluoro ethylene (PTFE), but thermal expansion, stiffness and bonding problems preclude its use.

In order to realize the benefits of the low dielectric contact of XYDAR ® or VECTRA ®, it will be necessary to use a low dielectric constant bonding resin. Some modified epoxies (e.g. acetylene terminated and bismaleimide-triazine blends) show promise.

Multiaxially oriented films of other molecularly oriented thermotropic liquid crystal polymers can be produced by the same techniques used to prepare XYDAR ® or VECTRA ® films. It is anticipated that these similar materials can be formed into multiaxially oriented films that might exhibit better compressive strengths than the XYDAR ® or VECTRA ® films without any significant reduction in tensile and modulus. Good electrical properties should be retained.

Modified films of the XYDAR ® or VECTRA ® and other molecularly oriented thermotropic polymers can be produced by a novel process which involves introducing a second material into the fibrillar microstructure of the polymer film when it is still in the molten state state as described herein.

This modification will produce films with improved compressive strength and interlaminar adhesion as compared to the neat film form without any significant sacrifice in tensile or modulus properties.

Two-phase interpenetrating network (IPN) materials can be made by infusing the XYDAR ® or VECTRA ® microstructure with another polymer (molecular composites are another two-phase material with rod-like molecules reinforcing a coil-like matrix polymer).

Several films which demonstrated improved laminating characteristics as compared with the neat XYDAR ® or VECTRA ® films when using epoxy adhesives included terta methoxysilane (TMOS); tetraethoxysilane (TEOS); glycidyloxypropyl trimethoxysilane (GPTMOS); methacryloxypropyl trimethoxysilane (MPTMOS); methyl trimethoxysilane (MTMOS); and dimethyldimethoxysilane (DMDMOS). These materials will be useful in creating multilayer PWB constructions.

The IPN approach can be viewed as a way of "prepregging" XYDAR ® or VECTRA ® film which will show benefits in improved flexural stiffness, better interlaminar adhesion and strength, improved surface adhesion for mounting components and plating conductors, and reduced voids and defects.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. As an article of manufacture, a printed wire board substrate prepared from a multiaxially oriented thermotropic liquid crystalline polymer film having a tailored coefficient of thermal expansion in the X-Y direction wherein the thickness of the film is not more than about 0.004 in.

2. The printed wire board substrate of claim 1, which further has the following characteristics:
   (a) is non-electrically conducting; and
   (b) has low-moisture absorption.
3. The printed wire board substrate of claim 2, wherein the moleculally oriented polymer is selected from XYDAR ® or VECTRA ®.
4. The printed wire board substrate of claim 3, which further comprises a copper layer bonded thereto.
5. The printed wire board substrate of claim 3, which has the following additional property:
   tailorable coefficient of thermal expansion (CTE) (X-Y direction) in range of from about 3 to $7 \times 10^{-6}$ in./in./°C.
6. The printed wire board substrate of claim 4, which has the following additional property:
   CTE of thickness (Z direction) approaching that of copper.
7. The printed wire board substrate of claim 3, which has the following additional property:
   low-moisture absorption, i.e., not exceeding about 0.5 percent at saturation.
8. The printed wire board substrate of claim 3, which further comprises a plurality of layers of molecularly oriented thermotropic liquid crystalline film, making up a multilayer laminated board.
9. The printed wire board substrate of claim 8, which further comprises a copper layer bonded thereto.
10. The printed wire board substrate of claim 8, which has the following additional property:
    maximum thickness of a single layer not exceeding about 0.0025 in.
11. The printed wire board substrate of claim 8, which has the following additional property:
    interlaminar shear strength greater than glass-/Kerimid 601 or equal to glass/epoxy.
12. The printed wire board substrate of claim 8, which has the following additional property:
    flexural strength equivalent to glass/ polyimide.
13. The printed wire board substrate of claim 8, which has the following additional property:
    dielectric constant not exceeding about 3.5 over the functional frequency range of 1 kHz to 500 MHz.
14. The printed wire board substrate of claim 8, which is capable of being employed as a high density substrate for leadless perimeter and grid array chip packages.
15. The printed wire board substrate of claim 14, wherein the chip package density requirements include 0.020-in. centers with up to 300 input/outputs (I/Os) for perimeter type packages and 0.050-in. center grid array type packages with up to 240 I/Os per device.
16. The copper coated PWB substrate of claim 4, wherein the copper has been deposited by means of plasma coating.
17. The copper coated PWB substrate of claim 4, wherein the copper has been deposited by means of ion plating.
18. The copper coated PWB substrate of claim 9, wherein the copper has been deposited by means of plasma coating.
19. The copper coated PWB substrate of claim 9, wherein the copper has been deposited by means of ion plating.
20. A method of forming a multilayer PWB substrate, comprising bonding together several layers of multiaxially oriented Xydar and/or Vectra film, the film having a tailored coefficient of thermal expansion, none of which layers exceeds about 0.0025 inches in thickness, thereby forming a multilayer board having a plurality of laminated multiaxially oriented film layers.
21. The article of claim 1, wherein the multiaxial orientation is balanced biaxial.

* * * * *